United States Patent
Yamamoto et al.

(10) Patent No.: US 6,226,503 B1
(45) Date of Patent: May 1, 2001

(54) DOUBLE-TUNED CIRCUIT

(75) Inventors: Masaki Yamamoto; Michinori Sasaki, both of Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/215,868

(22) Filed: Dec. 18, 1998

(30) Foreign Application Priority Data

Jan. 12, 1998 (JP) .................................... 10-003903

(51) Int. Cl.⁷ ...................................................... H04B 1/18
(52) U.S. Cl. ............................ 455/180.4; 455/188.1; 455/191.2
(58) Field of Search ............................ 455/180.1, 180.4, 455/188.1, 191.2, 191.3, 193.1, 193.3, 280; 348/730, 731; 333/14, 25

(56) References Cited

U.S. PATENT DOCUMENTS

| 4,584,544 | 4/1986 | Hettiger . |
| 5,285,179 | * 2/1994 | Wignot ............................... 455/180.4 |
| 5,619,283 | * 4/1997 | Puget ................................. 455/191.2 |

FOREIGN PATENT DOCUMENTS

| 1-240009 | 9/1989 | (JP) . |
| 5-235703 | 9/1993 | (JP) . |
| 8-107332 | 4/1996 | (JP) . |

* cited by examiner

*Primary Examiner*—Thanh Cong Le
(74) *Attorney, Agent, or Firm*—Brinks Hofer Gilson & Lione

(57) ABSTRACT

Between one end of a high-band tuning coil in a primary tuning circuit and one end of a high-band tuning coil in a secondary tuning circuit, a first switch diode and a second switch diode connected in series are provided. A second coupling coil is provided between the ground and the connection point of the first switch diode and the second switch diode. Both first switch diode and second switch diode are set to a continuity state or a non-continuity state to switch between a high-band state and a low-band state.

2 Claims, 4 Drawing Sheets

DOUBLE-TUNED CIRCUIT

BACKGROUND OF THE INVENTION

1. Field of the Invention

The present invention relates to a double-tuned circuit used as an inter-stage tuning circuit of a television-set tuner, and more specifically, to a double-tuned circuit in which a high-band coupling coil and a low-band coupling coil are independently provided to couple a primary tuning circuit with a secondary tuning circuit.

2. Description of the Related Art

FIG. 5 shows a conventional double-tuned circuit. In FIG. 5, a double-tuned circuit 51 is connected to a high-frequency amplifier (not shown) at an input end 51a and to a mixer (not shown) at an output end 51b.

The double-tuned circuit 51 is switched between a high band and a low band by a so-called band switching method.

A primary tuning circuit 51c is provided with a high-band tuning coil 52 and a low-band tuning coil 53 connected in series by one end of each coil. Between the connection point thereof and the ground, a switch diode 54 and a DC-blocking capacitor 55 connected in series are connected.

The cathode of the switch diode 54 is connected to the connection point of the high-band tuning coil 52 and the low-band tuning coil 53, and the other end of the high-band tuning coil 52 is connected to the input end 51a.

Between the input end 51a and the ground, a DC-blocking capacitor 56 and a varactor diode 57 connected in series are connected, and the anode of the varactor diode 57 is grounded.

A secondary tuning circuit 51d is provided with a high-band tuning coil 58 and a low-band tuning coil 59 connected in series by one end of each coil. Between the connection point thereof and the ground, a switch diode 60 and a DC-blocking capacitor 61 connected in series are connected.

The cathode of the switch diode 60 is connected to the connection point of the high-band tuning coil 58 and the low-band tuning coil 59, and the other end of the high-band tuning coil 58 is connected to the output end 51b.

Between the output end 51b and the ground, a DC-blocking capacitor 62 and a varactor diode 63 connected in series are connected, and the anode of the varactor diode 63 is grounded.

The other end of the low-band tuning coil 53 in the primary tuning circuit 51c is connected to the other end of the low-band tuning circuit 59 in the secondary tuning circuit 51d. Between the connection point thereof and the ground, a coupling coil 64 and a DC-blocking capacitor 65 connected in series are provided. The DC-blocking capacitor 65 is connected to the ground.

The connection point of the coupling coil 64 and the DC-blocking capacitor 65 is connected to one end of a feed resistor 66, and the other end thereof is connected to a low-band switching terminal 67.

The connection point of the anode of the switch diode 54 and the DC-blocking capacitor 55 in the primary tuning circuit 51c is connected to one end of a feed resistor 68, and the other end thereof is connected to a high-band switching terminal 69. In the same way, the connection point of the anode of the switch diode 60 and the DC-blocking capacitor 61 in the secondary tuning circuit 51d is connected to one end of a feed resistor 70, and the other end thereof is connected to the high-band switching terminal 69.

The connection point of the DC-blocking capacitor 56 and the varactor diode 57 in the primary tuning circuit 51c is connected to one end of a feed resistor 71, and the other end thereof is connected to a tuning voltage terminal 72. In the same way, the connection point of the DC-blocking capacitor 62 and the varactor 63 in the secondary tuning circuit 51d is connected to one end of a feed resistor 73, and the other end thereof is connected to the tuning voltage terminal 72.

In the above configuration, a tuning voltage is applied to the tuning voltage terminal 72. The voltage is changed to alter the capacitance of the varactor diode 57 in the primary tuning circuit 51c and the capacitance of the varactor diode 63 in the secondary tuning circuit 51d, and thereby the tuning frequency of the double-tuned circuit 51 is to be changed.

Band switching will be described below, in which the double-tuned circuit 51 is switched between a state in which a high-band television signal is received and a state in which a low-band television signal is received.

To switch the double-tuned circuit 51 shown in FIG. 5 to a state in which a low-band television signal is received, a band switching voltage of, for example, 5 V is applied to the low-band switching terminal 67. A voltage is applied to the switch diode 54 and the switch diode 60 in the reverse directions and both switch diodes 54 and 60 become a non-continuity state. Therefore, the double-tuned circuit 51 shown in FIG. 5 works as an equivalent circuit shown in FIG. 6.

In the equivalent circuit shown in FIG. 6, a coil 74 in the primary tuning circuit 51c indicates the high-band tuning coil 52 and the low-band tuning coil 53 connected in series, and a coil 75 in the secondary tuning circuit 51d indicates the high-band tuning coil 58 and the low-band tuning coil 59 connected in series.

The coupling coil 64 connected between the ground and the connection point of the coil 74 in the primary tuning circuit 51c and the coil 75 in the secondary tuning circuit 51d determines the coupling state between the primary tuning circuit 51c and the secondary tuning circuit 51d at a low band. The inductance thereof is specified in advance such that the double-tuned circuit 51 has a predetermined transfer characteristic. Therefore, the tuning coil 74 in the primary tuning circuit 51c and the tuning coil 75 in the secondary tuning circuit 51d do not cause direct inductive coupling.

On the other hand, to switch the double-tuned circuit 51 shown in FIG. 5 to a state in which a high-band television signal is received, a band switching voltage of, for example, 5 V is applied to the high-band switching terminal 69. A voltage is applied to the switch diode 54 and the switch diode 60 in the forward directions and both switch diodes 54 and 60 become a continuity state.

As a result, the connection point of the high-band tuning coil 52 and the low-band tuning coil 53 in the primary tuning circuit 51c, and the connection point of the high-band tuning coil 58 and the low-band tuning coil 59 in the secondary tuning circuit 51d are ground in high frequencies. Since the low-band tuning coil 53 in the primary tuning circuit 51c, the low-band tuning coil 59 in the secondary tuning circuit 51d, or the coupling coil 64 does not function, the double-tuned circuit 51 shown in FIG. 5 works as an equivalent circuit shown in FIG. 7.

Therefore, the high-band tuning coil 52 in the primary tuning circuit 51c and the high-band tuning coil 58 in the secondary tuning circuit 51d are disposed at a predetermined distance to be coupled to obtain a coupling state between the primary tuning circuit 51c and the secondary tuning circuit 51d.

In the conventional double-tuned circuit 51, however, the positional relationship (layout) between the high-band tuning coil 52 in the primary tuning circuit 51c and the high-band tuning coil 58 in the secondary tuning circuit 51d needs to be specified in advance to obtain an appropriate coupling state between the primary tuning circuit 51c and the secondary tuning circuit 51d in a state in which a high-band television signal is received. Therefore, the degree of freedom in designing the layout is limited.

SUMMARY OF THE INVENTION

Accordingly, it is an object of the present invention to increase the degree of freedom in designing the layout of the high-band tuning coil by independently providing coupling coils for a state in which a low-band television signal is received and for a state in which a high-band television signal is received.

The foregoing object is achieved according to the present invention through the provision of a double-tuned circuit including: a primary tuning circuit having a high-band tuning coil and a low-band tuning coil connected in series at one end of each coil; a secondary tuning circuit having a high-band tuning coil and a low-band tuning coil connected in series at one end of each coil; a first coupling coil disposed between the ground and the connection point where the other end of the low-band tuning coil in the primary tuning circuit is connected to the other end of the low-band tuning coil in the secondary tuning circuit; a first switch diode and a second switch diode connected in series disposed between the one end of the high-band tuning coil in the primary tuning circuit and the one end of the high-band tuning coil in the secondary tuning circuit; and a second coupling coil disposed between the ground and the connection point of the first switch diode and the second switch diode, wherein, when a high-band television signal is received, the first switch diode and the second switch diode are set to a continuity state; and when a low-band television signal is received, the first switch diode and the second switch diode are set to a non-continuity state.

Since coupling coils can be provided for both high band and low band, a limitation on the layout of not only the low-band tuning coil but also the high-band tuning coil is eliminated, and the degree of freedom in design is increased.

The double-tuned circuit may be configured such that it further includes a first switching terminal and a second switching terminal; the first switch diode and the second switch diode are connected in series by their anodes or by their cathodes; the anodes are connected to the first switching terminal in a DC-coupling manner; the cathodes are connected to the second switching terminal in a DC-coupling manner; and the first switch diode and the second switch diode are set to a continuity state or a non-continuity state by a band switching voltage applied to the first switching terminal and the second switching terminal.

In this case, switching between the high band and the low band is made easy.

The double-tuned circuit may be further configured such that the first coupling coil is connected to the ground through a first DC-blocking capacitor; the second coupling coil is connected to the ground through a second DC-blocking capacitor; the connection point of the first coupling coil and the first DC-blocking capacitor is connected to the first switching terminal in a DC-coupling manner; and the connection point of the second coupling coil and the second DC-blocking capacitor is connected to the second switching terminal in a DC-coupling manner.

In this case, the first switch diode and the second switch diode are easily connected to the first switching terminal and the second switching terminal.

DESCRIPTION OF THE PREFERRED EMBODIMENTS

Figure 1:
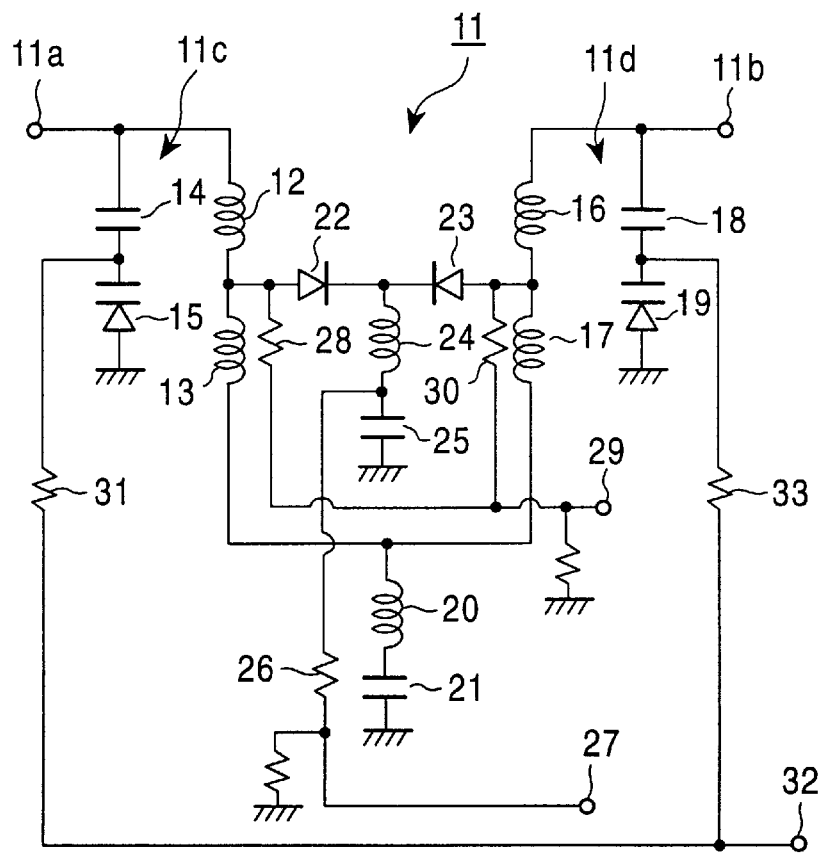
FIG. 1 is a circuit diagram of a double-tuned circuit according to an embodiment of the present invention.

FIG. 1 shows a double-tuned circuit according to the present invention. In FIG. 1, a double-tuned circuit 11 is connected to a high-frequency amplifier (not shown) at an input end 11a and to a mixer (not shown) at an output end 11b.

The double-tuned circuit 11 is switched between a high band and a low band by a so-called band switching method.

A primary tuning circuit 11c is provided with a high-band tuning coil 12 and a low-band tuning coil 13 connected in series by one end of each coil. The other end of the high-band tuning coil 12 is connected to the input end 11a.

Between the input end 11a and the ground, a DC-blocking capacitor 14 and a varactor diode 15 connected in series are connected, and the anode of the varactor diode 15 is grounded.

A secondary tuning circuit 11d is provided with a high-band tuning coil 16 and a low-band tuning coil 17 connected in series by one end of each coil. The other end of the high-band tuning coil 16 is connected to the output end 11b.

Between the output end 11b and the ground, a DC-blocking capacitor 18 and a varactor diode 19 connected in series are connected, and the anode of the varactor diode 19 is grounded.

The other end of the low-band tuning coil 13 in the primary tuning circuit 11c is connected to the other end of the low-band tuning circuit 17 in the secondary tuning circuit 11d. Between the connection point thereof and the ground, a first coupling coil 20 and a first DC-blocking capacitor 21 connected in series are connected. The first DC-blocking capacitor 21 is connected to the ground.

Between the connection point of the high-band tuning coil 12 and the low-band tuning coil 13 in the primary tuning circuit 11c, and the connection point of the high-band tuning coil 16 and the low-band tuning coil 17 in the secondary tuning circuit 11d, a first switch diode 22 and a second switch diode 23 connected in series are provided.

The connection point of the high-band tuning coil 12 and the low-band tuning coil 13 in the primary tuning circuit 11c is connected to the anode of the first switch diode 22, and the connection point of the high-band tuning coil 16 and the low-band tuning coil 17 in the secondary tuning circuit 11d is connected to the second switch diode 23.

Between the ground and the connection point of the first switch diode 22 and the second switch diode 23, a second coupling coil 24 and a DC-blocking capacitor 25 connected in series are provided. The second DC-blocking capacitor 25 is connected to the ground.

The connection point of the second coupling coil 24 and the second DC-blocking capacitor 25 is connected to one end of a feed resistor 26, and the other end thereof is connected to a first switching terminal 27.

The connection point of the high-band tuning coil 12 and the low-band tuning coil 13 in the primary tuning circuit 11c is connected to one end of a feed resistor 28, and the other end thereof is connected to a second switching terminal 29. In the same way, the connection point of the high-band tuning coil 16 and the low-band tuning coil 17 in the secondary tuning circuit 11d is connected to one end of a feed resistor 30, and the other end thereof is connected to the second switching terminal 29.

The connection point of the DC-blocking capacitor 14 and the varactor diode 15 in the primary tuning circuit 11c is connected to one end of a feed resistor 31, and the other end thereof is connected to a tuning voltage terminal 32. In the same way, the connection point of the DC-blocking capacitor 18 and the varactor diode 19 in the secondary tuning circuit 11d is connected to one end of a feed resistor 33, and the other end thereof is connected to the tuning voltage terminal 32.

Band switching will be described below, in which the double-tuned circuit 11 is switched between a state in which a high-band television signal is received and a state in which a low-band television signal is received.

To switch the double-tuned circuit 11 shown in FIG. 1 to a state in which a low-band television signal is received, a band switching voltage of, for example, 5 V is applied to the first switching terminal 27. A voltage is applied to the first switch diode 22 and the second switch diode 23 in the reverse directions and both first switch diode 22 and second switch diode 23 become a non-continuity state. Therefore, the double-tuned circuit 11 shown in FIG. 1 works as an equivalent circuit shown in FIG. 2.

Figure 2:
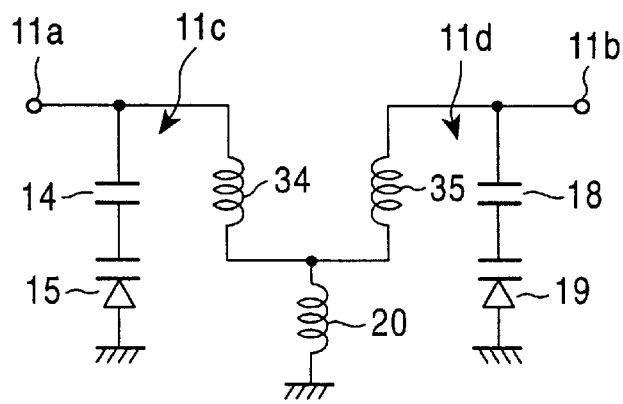
FIG. 2 is an equivalent circuit of the double-tuned circuit according to the present invention in a low-band state.

In the equivalent circuit shown in FIG. 2, a coil 34 in the primary tuning circuit 11c indicates the high-band tuning coil 12 and the low-band tuning coil 13 connected in series, and a coil 35 in the secondary tuning circuit 11d indicates the high-band tuning coil 16 and the low-band tuning coil 17 connected in series.

The first coupling coil 20 connected between the ground and the connection point of the tuning coil 34 in the primary tuning circuit 11c and the tuning coil 35 in the secondary tuning circuit 11d determines the coupling state between the primary tuning circuit 11c and the secondary tuning circuit 11d at a low band. The inductance thereof is specified in advance such that the double-tuned circuit 11 has a predetermined transfer characteristic. Therefore, the tuning coil 34 in the primary tuning circuit 11c and the tuning coil 35 in the secondary tuning circuit 11d do not cause direct inductive coupling.

On the other hand, to switch the double-tuned circuit 11 shown in FIG. 1 to a state in which a high-band television signal is received, a band switching voltage of, for example, 5 V is applied to the second switching terminal 29. A voltage is applied to the first switch diode 22 and the second switch diode 23 in the forward directions and both switch diodes 22 and 23 become a continuity state.

Figure 3:
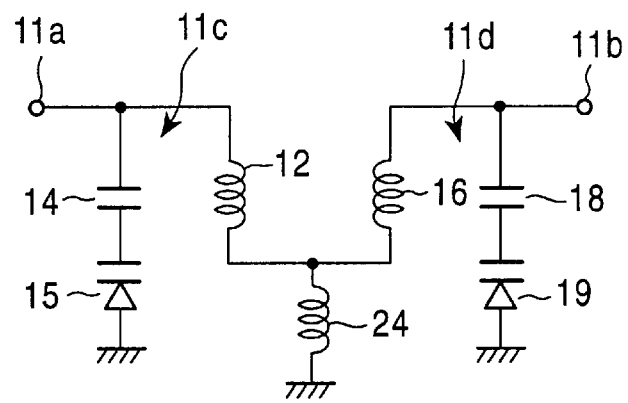
FIG. 3 is an equivalent circuit of the double-tuned circuit according to the present invention in a high-band state.

As a result, the connection point of the high-band tuning coil 12 and the low-band tuning coil 13 in the primary tuning circuit 11c, and the connection point of the high-band tuning coil 16 and the low-band tuning coil 17 in the secondary tuning circuit 11d are ground through the second coupling coil 24 and are also connected to the ground through the low-band tuning coil 13 in the primary tuning circuit 11c and the low-band tuning circuit 17 in the secondary tuning circuit 11d. Since the inductances of the two low-band tuning coils 13 and 17 are sufficiently larger than that of the second coupling capacitor 24 and therefore can be ignored, the double-tuned circuit 11 shown in FIG. 1 works as an equivalent circuit shown in FIG. 3.

The second coupling coil 24 connected between the ground and the connection point of the high-band tuning coil 12 in the primary tuning circuit 11c and the high-band tuning coil 16 in the secondary tuning circuit 11d determines the coupling state between the primary tuning circuit 11c and the secondary tuning circuit 11d at a high band. The inductance thereof is specified in advance such that the double-tuned circuit 11 has a predetermined transfer characteristic in the high band. Therefore, the high-band tuning coil 12 in the primary tuning circuit 11c and the high-band tuning coil 16 in the secondary tuning circuit 11d need not be directly inductive-coupled.

When the first switch diode 22 and the second switch diode 23 are connected in series by their anodes, a band switching voltage of, for example, 5 V is applied to the second switching terminal 29 to switch to the low-band state, and a band switching voltage of, for example, 5 V is applied to the first switching terminal 27 to switch to the high-band state.

Figure 4:
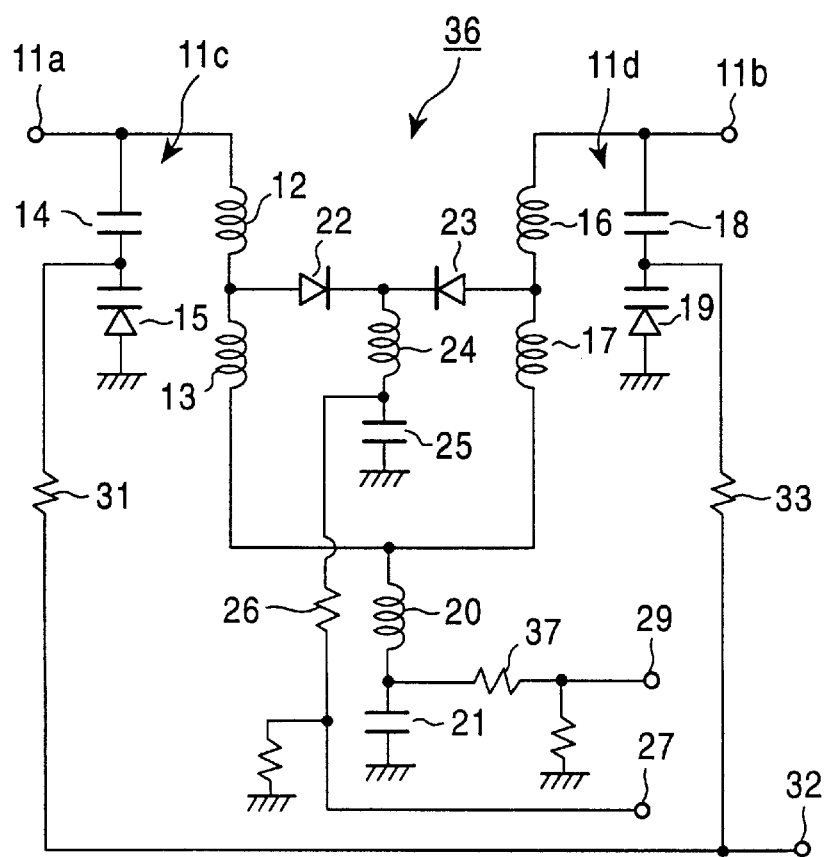
FIG. 4 is a circuit diagram of a double-tuned circuit according to another embodiment of the present invention.
Figure 5:
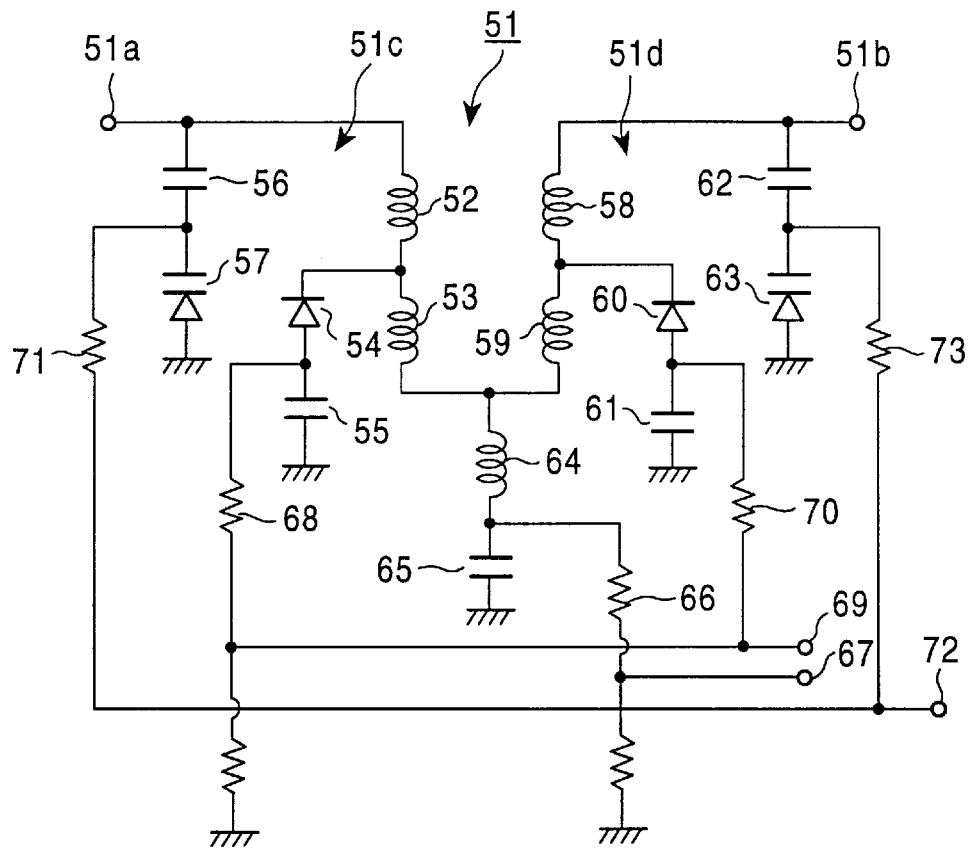
FIG. 5 is a circuit diagram of a conventional double-tuned circuit.
Figure 6:
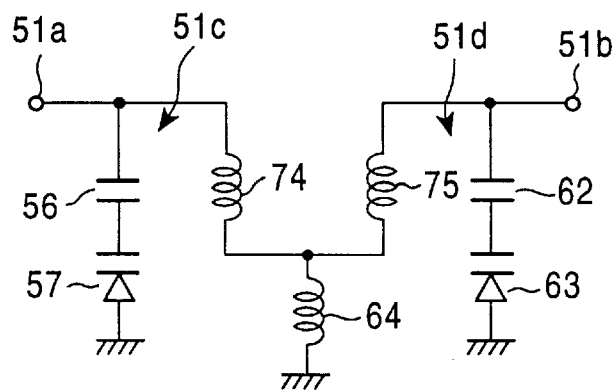
FIG. 6 is an equivalent circuit of the conventional double-tuned circuit in a low-band state.
Figure 7:
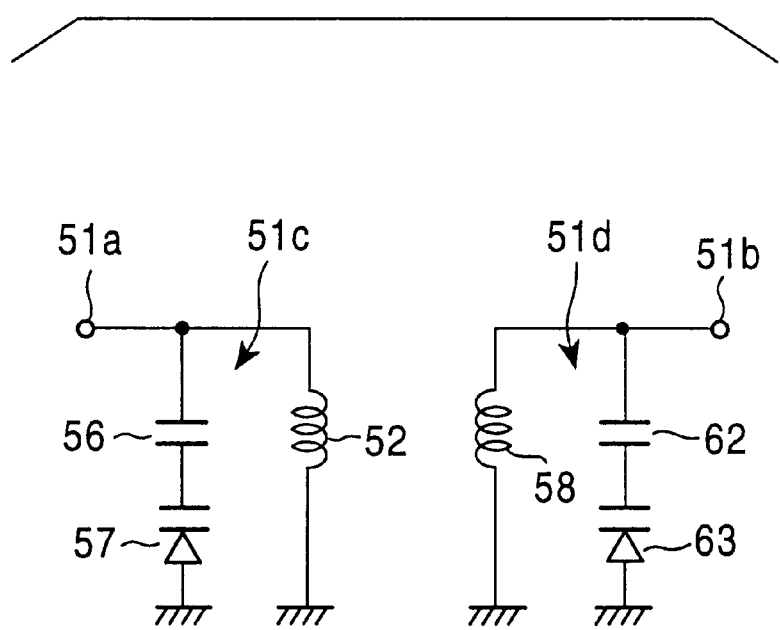
FIG. 7 is an equivalent circuit of the conventional double-tuned circuit in a high-band state.

FIG. 4 shows another double-tuned circuit which obtains the same advantages as the double-tuned circuit 11 shown in FIG. 1.

In a double-tuned circuit 36, the feed resistors 28 and 30 in the double-tuned circuit 11 shown in FIG. 1 are omitted, and instead, the connection point of the first coupling coil 20 and the first DC-blocking capacitor 21 is connected to one end of a feed resistor 37 and the other end thereof is connected to the second switching terminal 29. Switching between a high band and a low band is performed in the same way as in the double-tuned circuit 11 shown in FIG. 1.

Since the circuit is configured in this way, wiring between the first switch diode 22 and the second switch diode 23, and the first switching terminal 27 and the second switching terminal 29 becomes simple.

What is claimed is:

1. A double-tuned circuit comprising:
   a primary tuning a circuit having a high-band tuning coil and a low-band tuning coil connected in series at one end of each coil;
   a secondary tuning circuit having a high-band tuning coil and a low-band tuning coil connected in series at one end of each coil;
   a first coupling coil disposed between the ground and a connection point where the other end of the low-band turning coil in said primary tuning circuit is connected to the other end of the low-band tuning coil in said secondary tuning circuit;
   a first switch diode and a second switch diode connected in series disposed between the one end of the high-band tuning coil in said primary tuning circuit and the one end of the high-band tuning coil in said secondary tuning circuit;
   a second coupling coil disposed between the ground and the connection point of said first switch diode and said second switch diode, wherein, when a high-band television signal is received, said first switch diode and said second switch diode are set to a continuity state, and when a low-band television signal is received, said first switch diode and said second switch diode are set to non-continuity state; and a first switching terminal and a second switching terminal, wherein said first switch diode and said second switch diode are connected in series by their anodes or by their cathodes;

the anodes are connected to said first switching terminal in a DC-coupling manner the cathodes are connected to said second switching terminal in a DC-coupling manner; and said first switch diode and said second switch diode are set to the continuity state and the non-continuity state by a band switching voltage applied to said first switching terminal and said second switching terminal.

2. A double-tuned circuit comprising:

a primary tuning a circuit having a high-band tuning coil and a low-band tuning coil connected in series at one end of each coil;

a secondary tuning circuit having a high-band tuning coil and a low-band tuning coil connected in series at one end of each coil;

a first coupling coil disposed between the ground and a connection point where the other end of the low-band turning coil in said primary tuning circuit is connected to the other end of the low-band tuning coil in said secondary tuning circuit;

a first switch diode and a second switch diode connected in series disposed between the one end of the high-band tuning coil in said primary tuning circuit and the one end of the high-band tuning coil in said secondary tuning circuit;

a second coupling coil disposed between the ground and the connection point of said first switch diode and said second switch diode, wherein, when a high-band television signal is received, said first switch diode and said second switch diode are set to a continuity state; and when a low-band television signal is received, said first switch diode and said second switch diode are set to non-continuity state; and a first switching terminal and a second switching terminal, wherein said first switch diode and said second switch diode are connected in series by their anodes or by their cathodes;

the anodes are connected to said first switching terminal in a DC-coupling manner;

the cathodes are connected to said second switching terminal in a DC-coupling manner; and said first switch diode and said second switch diode are set to a continuity state or a non-continuity state by a band switching voltage applied to said first switching terminal and said second switching terminal, wherein said first coupling coil is connected to the ground through a first DC-blocking capacitor;

said second coupling coil connected to the ground through a second DC-blocking capacitor;

the connection point of said first coupling coil and the first DC-blocking capacitor is connected to said first switching terminal in a DC-coupling manner; and the connection point of said second coupling coil and the second DC-blocking capacitor is connected to said second switching terminal in a DC-coupling manner.

* * * * *